(12) United States Patent
Dathe et al.

(10) Patent No.: US 7,786,789 B2
(45) Date of Patent: Aug. 31, 2010

(54) MONOLITHIC INTEGRATED CIRCUIT AND USE OF A SEMICONDUCTOR SWITCH

(75) Inventors: Lutz Dathe, Dresden (DE); Henry Drescher, Radebeul (DE)

(73) Assignee: Atmel Automotive GmbH, Heilbronn (DE)

( * ) Notice: Subject to any disclaimer, the term of this patent is extended or adjusted under 35 U.S.C. 154(b) by 4 days.

(21) Appl. No.: 12/268,020

(22) Filed: Nov. 10, 2008

(65) Prior Publication Data

US 2009/0121774 A1    May 14, 2009

Related U.S. Application Data

(60) Provisional application No. 60/987,621, filed on Nov. 13, 2007.

(30) Foreign Application Priority Data

Nov. 9, 2007    (DE) .................. 10 2007 053 874

(51) Int. Cl.
*H03K 17/687* (2006.01)
(52) U.S. Cl. .................. 327/427; 327/434; 323/265
(58) Field of Classification Search .................. 327/427, 327/434; 323/265, 266, 272
See application file for complete search history.

(56) References Cited

U.S. PATENT DOCUMENTS

| | | | | |
|---|---|---|---|---|
| 5,373,225 A * | 12/1994 | Poletto et al. | ............... | 323/282 |
| 5,490,055 A * | 2/1996 | Boylan et al. | ................. | 363/41 |
| 5,894,216 A * | 4/1999 | Cohen | ........................ | 323/284 |
| 6,362,606 B1 * | 3/2002 | Dupuis et al. | ............... | 323/272 |
| 6,414,469 B1 * | 7/2002 | Zhou et al. | .................. | 323/272 |
| 6,559,624 B1 * | 5/2003 | Hong | ......................... | 323/280 |
| 6,570,369 B2 * | 5/2003 | Tamai et al. | ................. | 323/288 |
| 6,580,258 B2 * | 6/2003 | Wilcox et al. | ............... | 323/282 |
| 6,621,257 B2 * | 9/2003 | Mitamura et al. | ........... | 323/282 |
| 6,642,696 B2 * | 11/2003 | Tateishi | ...................... | 323/222 |
| 6,759,835 B2 * | 7/2004 | Turvey et al. | ............... | 323/282 |
| 6,828,766 B2 * | 12/2004 | Corva et al. | ................. | 323/284 |

(Continued)

FOREIGN PATENT DOCUMENTS

DE    102 53 980 A1    6/2004

(Continued)

OTHER PUBLICATIONS

Jean-Michel Redoute et al., "An EMI Resisting LIN Driver to 0.35-micron High-Voltage CMOS", IEEE Journal of Solid-State Circuits, vol. 42, No. 7, Jul. 2007.

*Primary Examiner*—Kenneth B. Wells
(74) *Attorney, Agent, or Firm*—Muncy, Geissler, Olds & Lowe, PLLC

(57) ABSTRACT

A monolithic integrated circuit is provided that includes a semiconductor switch, a constant current source, a capacitor, and a load circuit, which has a load capacitance. An output of the semiconductor switch is connected to the load circuit to turn on and off a supply voltage of the load circuit. The capacitor is connected to the output of the semiconductor switch and to a control input of the semiconductor switch. The constant current source can be or is connected to the control input of the semiconductor switch. Also, a use of a semiconductor switch is provided to reduce the leakage current of a load circuit of a monolithic integrated circuit.

12 Claims, 3 Drawing Sheets

U.S. PATENT DOCUMENTS

| | | |
|---|---|---|
| 6,963,190 B2 * | 11/2005 | Asanuma et al. ............ 323/283 |
| 7,176,664 B1 * | 2/2007 | Potanin et al. ............. 323/280 |
| 7,253,594 B2 * | 8/2007 | Paul et al. .................. 323/268 |
| 7,362,078 B2 * | 4/2008 | Agari ......................... 323/268 |
| 7,443,146 B2 * | 10/2008 | Wei et al. ................... 323/224 |
| 7,541,788 B2 * | 6/2009 | Katoh et al. ................ 323/282 |
| 2004/0263237 A1 | 12/2004 | Kim et al. |
| 2005/0068059 A1 | 3/2005 | Takahashi et al. |
| 2006/0158232 A1 | 7/2006 | Lenz |

FOREIGN PATENT DOCUMENTS

| | | |
|---|---|---|
| WO | WO 97/12443 A1 | 4/1997 |
| WO | WO 2006/090344 A1 | 8/2006 |

* cited by examiner

MONOLITHIC INTEGRATED CIRCUIT AND USE OF A SEMICONDUCTOR SWITCH

This nonprovisional application claims priority to German Patent Application No. 10 2007 053 874.1, which was filed in Germany on Nov. 9, 2007, and to U.S. Provisional Application No. 60/987,621, which was filed on Nov. 13, 2007, and which are both herein incorporated by reference.

BACKGROUND OF THE INVENTION

1. Field of the Invention

The present invention relates to a monolithic integrated circuit and use of a semiconductor switch.

2. Description of the Background Art

If a monolithic integrated circuit has many digital and/or analog subcircuits, these subcircuits, even when not in use, generate a significant leakage current, which in battery-supplied circuits results in a shortening of the operating time with one and the same battery. To lengthen the operating time, it is possible to turn off unused subcircuits from the voltage supply and to turn them on again only when these are needed.

SUMMARY OF THE INVENTION

It is therefore an object of the present invention to provide an improved monolithic integrated circuits and the use of a semiconductor switch as much as possible.

Accordingly, a circuit is provided in which a semiconductor switch, a constant current source, a capacitor, and at least one load circuit are monolithically integrated. The load circuit has a load capacitance.

Any type of monolithic integrated semiconductor element capable of switching the supply current needed for the load circuit during normal operation can be used for the semiconductor switch. This type of semiconductor switch is, for example, a MOS field-effect transistor, a junction field-effect transistor, or a bipolar transistor.

The constant current source can be formed to output a constant current. In this case, a constant current source is understood to be both a source and a drain depending on the positive or negative current direction.

The monolithic integrated capacitor can be formed in fact in principle by a junction capacitance; it is preferable, however, that the capacitor is formed by two electrodes with dielectric between the electrodes as a monolithic integrated plate capacitor.

The load circuit preferably has a plurality of elements whose (parasitic) single capacitances form the load capacitance. Preferably, the monolithic integrated circuit is formed in such a way that a surge peak caused by the load capacitance of the switched current is limited.

An output of the semiconductor switch, for example, a drain of a field-effect transistor or an emitter of a bipolar transistor, is connected to the load circuit to turn on and off a supply voltage for the load circuit. Preferably, for this purpose, one (or more) supply voltage terminal of the load circuit can be connected to the output of the semiconductor switch.

The capacitor can be connected to the output of the semiconductor switch and to a control input of the semiconductor switch, for example, to a gate of a field-effect transistor or a base of a bipolar transistor.

The constant current source can be connected to the control input of the semiconductor switch or can be connected, for example, by means of a switch. The connections are preferably made by metal tracks of the metallization levels of the monolithic integrated circuit. Preferably, the constant current source together with the capacitor forms an integrator.

In an embodiment, a voltage regulator can be provided to provide a supply voltage, which is connected to an input of the semiconductor switch, for example, to a source of a field-effect transistor or to a collector of a bipolar transistor. The voltage regulator, in this case, provides at its output a regulated voltage, particularly, a constant voltage.

In another embodiment, the constant current source can have a current control input for switching a constant current of the constant current source. Preferably, the constant current can be turned on and off by means of a control signal at the current control input. Advantageously, the current control input is connected directly or indirectly, for example, via a logic, to the load circuit, so that the load circuit controls the constant current.

In another, embodiment, the monolithic integrated circuit can have a threshold switch, whose input is connected to the constant current source. This type of threshold switch is, for example, a (window) comparator, a Schmitt trigger, or a simple inverter. The threshold switch can compare the voltage at the juncture to the constant current source by means of one or two thresholds. Preferably, the threshold switch compares the voltage drop across the constant current source with at least one threshold.

According to an embodiment, the output of the threshold switch can be connected directly or indirectly, for example, via an evaluation logic and/or via a circuit logic and/or a control circuit, to an input of the load circuit. Advantageously, the input of the load circuit is an interrupt input (IRQ); in this case, a program run of the load circuit can be interrupted by means of the output signal of the threshold switch.

According to an embodiment, the monolithic integrated circuit can have a first transistor, which is connected to the control input of the semiconductor switch. A first control input of the first transistor is connected to the threshold switch. Therefore, depending on the output value of the threshold switch, the first transistor can be turned on to connect, for example, the control input to a constant potential.

According to another, also combinable embodiment, the monolithic integrated circuit can have a second transistor, which is connected to the first transistor to form a logic AND operation. Preferably, a second control input of the second transistor is connected to the current control input of the constant current source.

Another aspect of the invention, achieving the object, is a use of a semiconductor switch to reduce a leakage current of a load circuit. The load circuit is integrated monolithically together with the semiconductor switch.

The semiconductor switch can be connected to a voltage regulator, which provides a supply voltage for the load circuit. An output of the semiconductor switch is connected to the load circuit to turn the supply voltage on and off, to reduce the leakage current.

An integrator whose output can be connected to a control input of the semiconductor switch is connected to the output of the semiconductor switch. An output value of the integrator controls a switching resistance of the semiconductor switch by means of this connection. The switching resistance of the semiconductor switch, in this case, is the semiconductor switch resistance set during the control process, whereby the resistance of the semiconductor switch determines the charging and/or discharging of the load capacitance of the load circuit. This switching resistor is changed by the output value of the integrator during the charging and/or discharging the load capacitance.

An integrator is an integration member, which has an integrative transfer behavior. Preferably, a voltage drop across the capacitor as an output value is assigned to a time course of a current of the constant current source for a voltage range of the integration.

According to an embodiment, the load circuit has a number of digital and/or analog functions.

At least one of the functions can be started and/or stopped depending on the output value of the integrator. This type of function is, for example, an initialization of a program run of a digital logic or analog amplification.

According to another embodiment, the integrator can have a controllable input. The integrator can be controlled for starting and/or stopping at least one of the functions. For example, the integrator is controlled by a higher-order logic.

In an embodiment, the load circuit can be switched between an operating mode and a sleep mode with a reduced current consumption. In the operating mode, preferably one or more functions are performed simultaneously or one after another. In the sleep mode, in contrast, the current uptake is significantly reduced. Before a switch to the sleep mode, values of the program run can be advantageously stored.

Preferably, in the sleep mode, the leakage current of the load circuit can be minimized by means of the semiconductor switch. To this end, the semiconductor switch blocks, so that the remaining leakage current is determined by the semiconductor switch. To this end, the semiconductor switch advantageously has an especially low leakage current.

In an embodiment, a plurality of load circuits of a monolithic integrated circuit can be provided each with a semiconductor switch to reduce the leakage current of the respectively connected load circuit. Only the load circuits required for the actual function are switched to an operating mode. On the contrary, the leakage current of the remaining load circuits is turned off.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
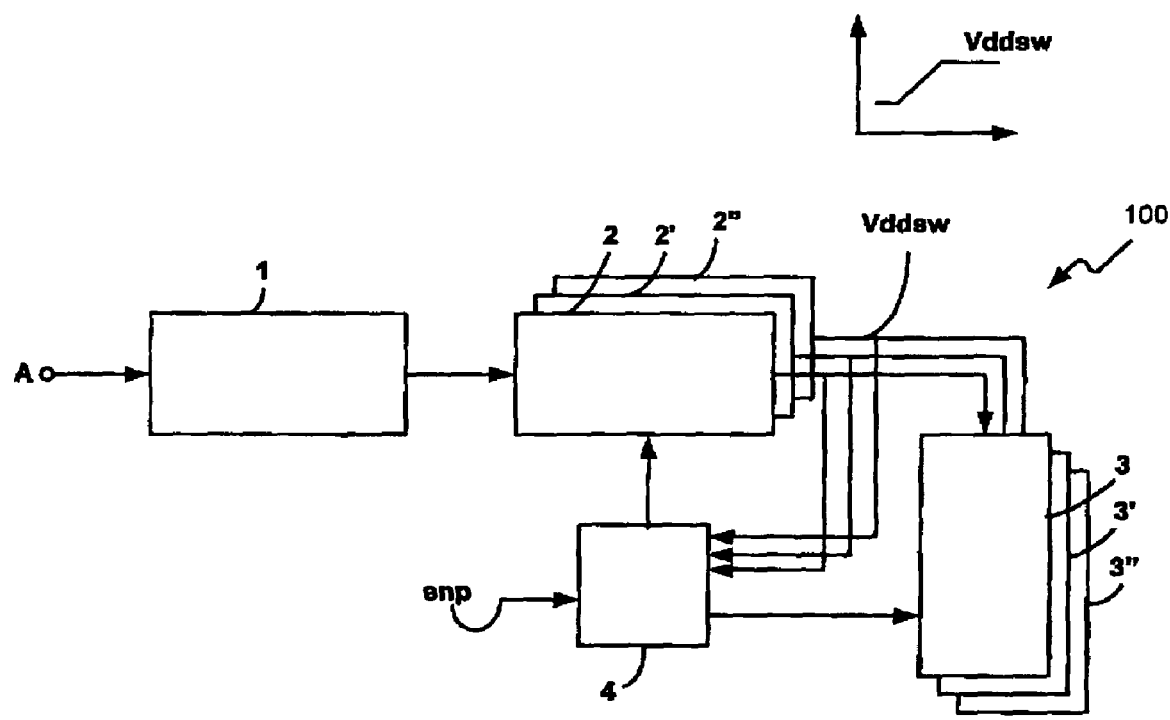
FIG. 1 shows a schematic block circuit diagram of a first exemplary embodiment of a monolithic integrated circuit.

FIG. 1 shows a schematic block circuit diagram. It has a first subcircuit 1, which is connected to a terminal A and to a second subcircuit 2. The first subcircuit 1 provides a supply voltage and is, for example, a voltage regulator.

Second subcircuit 2 is connected to first subcircuit 1 and a third subcircuit 3. Second subcircuit 2 has a semiconductor switch. Third subcircuit 3 is a load circuit, which has a load capacitance. When the semiconductor switch of second subcircuit 2 is turned on, third subcircuit 3 stresses first subcircuit 1 as a load by removing current, so that a positive or negative current flows from first subcircuit 1 via second subcircuit 2 to third subcircuit 3. The controllable or switchable supply voltage Vddsw to supply third subcircuit 3 is, therefore, applied at the output of second subcircuit 2 and at the connection to third subcircuit 3.

Third subcircuit 3, when not being used as well, causes a not negligible (positive or negative) leakage current. The function of second subcircuit 2 is therefore that, when not used, third circuit 3 is turned off by the semiconductor switch, so that the remaining leakage current is substantially determined by the leakage current of the semiconductor switch of the second subcircuit 2 itself and therefore is greatly reduced.

In monolithic integrated circuits, the maximum current drain from first subcircuit 1 may not exceed a maximum value of a few milliamperes (for example, 50 mA). Otherwise, the entire circuit could operate unreliably or even a destruction of first subcircuit 1 could result.

The load capacitance of third subcircuit 3 has the effect that at the time when the turning on occurs, the feeder resistances and the resistance of the semiconductor switch of second subcircuit 2 limit a starting current. This starting current also may not exceed the aforementioned maximum value. It is therefore a goal to limit selectively the starting current by controlling the semiconductor switch of second subcircuit 2. After the charging of the load capacitance of third subcircuit 3, the semiconductor switch of second subcircuit 2 should be as low-impedance as possible, to minimize the losses.

For this reason, in the ideal case, the semiconductor switch of second subcircuit 2 should be completely open when the load capacitance of third subcircuit 3 is fully charged. In fact, the voltage drop could be measured at the semiconductor switch and compared with a threshold value, but because of tolerances in the manufacturing process, this can be realized only with high circuit engineering cost, because the voltage drop to be detected approaches "zero" but does not cross the zero value.

In the exemplary embodiment of FIG. 1, a fourth subcircuit 4 is provided which has an integrator. The output of fourth subcircuit 4 is connected to second subcircuit 2 to control the semiconductor switch. Furthermore, fourth subcircuit 4 has a first input at which a control signal enp can be applied. The control signal enp controls the integration function of the integrator. Another input of fourth subcircuit 4 is connected to second subcircuit 2 and third subcircuit 3. The controllable or switchable supply voltage Vddsw is applied at this additional input of fourth subcircuit 4.

The integrator integrates a constant value depending on the control signal enp, so that the output value of the integrator over time t is a ramp (with a substantially linear slope). In the case of turn-on, this ramp causes a substantially linear rise in the controllable or switchable supply voltage Vddsw at the output of second subcircuit 2, as is shown schematically in a diagram in FIG. 1. The output value of the integrator of fourth subcircuit 4 thus controls a load behavior of the semiconductor switch of second subcircuit 2, in that in the case of turn-on, the resistance in the contact gap of the semiconductor switch declines steadily. To control the functions of subcircuit 3, subcircuit 4 is connected to said circuit.

Figure 2:
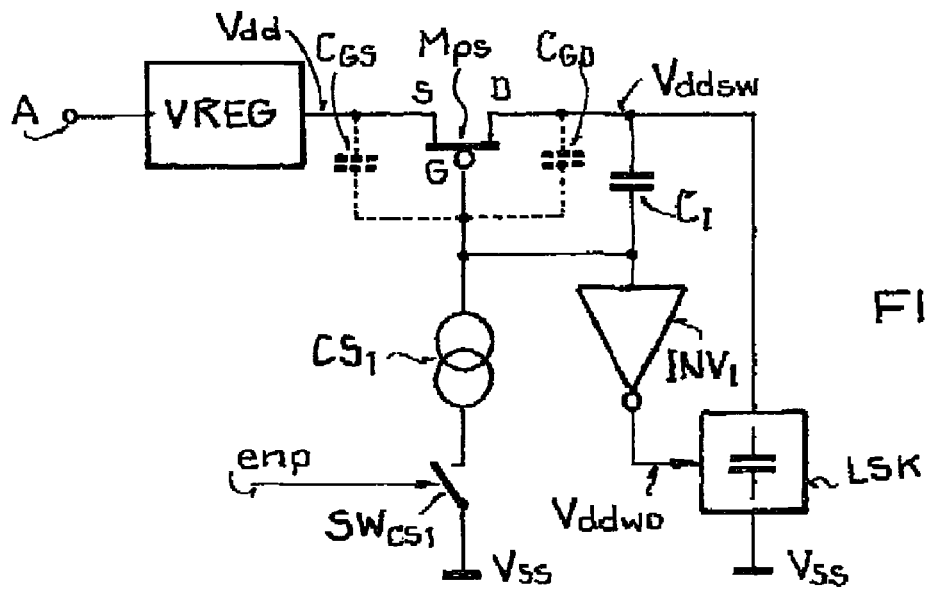
FIG. 2 shows a schematic circuit diagram of a second exemplary embodiment with a PMOS field-effect transistor as a semiconductor switch.

FIG. 2 shows a schematic circuit diagram of a second exemplary embodiment. A voltage regulator VREG, which provides the voltage Vdd for the load circuit LSK, is connected at terminal A. Only a single load circuit LSK is shown in FIG. 2 for simpler comprehensibility. In a monolithic integrated circuit, however, a plurality of load circuits is supplied with the voltage Vdd, a field-effect transistor Mps or another transistor being connected between the voltage regulator VREG and each disconnectable load circuit LSK. In the exemplary embodiment of FIG. 2, a PMOS field-effect transistor Mps is used as the semiconductor switch.

An input S (source) of the PMOS field-effect transistor Mps is connected to the voltage regulator VREG. Furthermore, an output D (drain) of the PMOS field-effect transistor Mps is connected to the assigned load circuit LSK. The control input G of the PMOS field-effect transistor Mps (gate) is connected to a constant current source $CS_1$, which can be switched by means of a switch $SW_{CS1}$. The switch $SW_{CS1}$ can be controlled in its switching state by the control signal enp. The switch $SW_{CS1}$ is furthermore connected to a supply voltage Vss (for example, 0 V).

The control input G of the PMOS field-effect transistor Mps (gate) is connected further to a terminal of a capacitor $C_I$, whereas the other terminal of capacitor $C_I$ is connected to the output D (drain) of the PMOS field-effect transistor Mps. Therefore, capacitor $C_I$ is connected parallel to parasitic gate-drain capacitance $C_{GD}$ of the PMOS field-effect transistor Mps. Furthermore, the PMOS field-effect transistor Mps naturally also has a parasitic gate-source capacitance $C_{GS}$, which is irrelevant, however, for the mode of operation of the circuit. Capacitor $C_I$ is also part of the monolithic integrated circuit. In so doing, it is not necessary that capacitor $C_I$ of the PMOS field-effect transistor Mps is spatially separated. Thus, it is also possible to make the gate electrode of the PMOS field-effect transistor Mps larger and to use it as the capacitor electrode, so that capacitor C, is directly adjacent to the PMOS field-effect transistor Mps.

If the load circuit LSK is to be supplied with current, therefore, the voltage Vdd is to be switched to the load circuit LSK, thus the switch $SW_{CS1}$ is closed first by the signal enp. The switch $SW_{CS1}$ in the exemplary embodiment of FIG. 2 is, for example, an NMOS field-effect transistor or an NPN bipolar transistor. The gate-source voltage is substantially the difference between Vdd and the voltage dropping across the constant current source. The gate-source voltage is also equal to the sum of the drain-source voltage and the voltage dropping across capacitor $C_I$.

The charge time constant and therefore this slope of the ramp for the voltage Vddsw is defined substantially by the constant current through the constant current source CS1 and the capacitance value of capacitor $C_I$, when the parasitic gate-drain capacitance $C_{GD}$ is small compared with the capacitance of capacitor $C_I$. Otherwise, the sum of $C_{GD}$ and $C_I$ is within the definition and the following applies:

$$t = \frac{(C_1 + C_{GS}) \cdot \Delta U}{I_{CS1}},$$

where $\Delta U$ is the required voltage difference until the turning on of the PMOS field-effect transistor Mps and $I_{CS1}$ is the constant current of the constant current source $CS_1$.

A threshold switch, which is a simple inverter $INV_1$ in the exemplary embodiment of FIG. 2, is moreover connected to the control input G (gate) of the PMOS field-effect transistor Mps. The threshold switch $INV_1$ is formed to output a digital status signal Vddwo to the load circuit LSK depending on the voltage of the control input G (gate) of the PMSO field-effect transistor Mps. The status signal Vddwo thereby depends on the output value of the integrator formed by the capacitor $C_I$ and the constant current source $CS_1$. The load circuit LSK in the exemplary embodiment of FIG. 2 is a digital logic, which enables a program run with a plurality of functions. For example, a function of this type is the encryption of a data signal to be sent or initialization of the digital logic of the load circuit LSK.

Advantageously, the digital logic of the load circuit LSK can be controlled by the load circuit LSK as a function of the status signal Vddwo. For the control, the digital logic of the load circuit LSK can be advantageously initialized and/or activated and/or deactivated and/or a program run of the digital logic can be interrupted (IRQ—Interrupt ReQuest). When, for example, the PMOS field-effect transistor Mps turns on completely, the gate potential changes in the direction of the supply voltage Vss. The negative edge change of the gate potential is inverted by inverter $INV_1$ to a positive edge change of the status signal; the digital logic of the load circuit LSK is advantageously initialized or activated as a function of the positive edge change of the status signal Vddwo.

Figure 3:
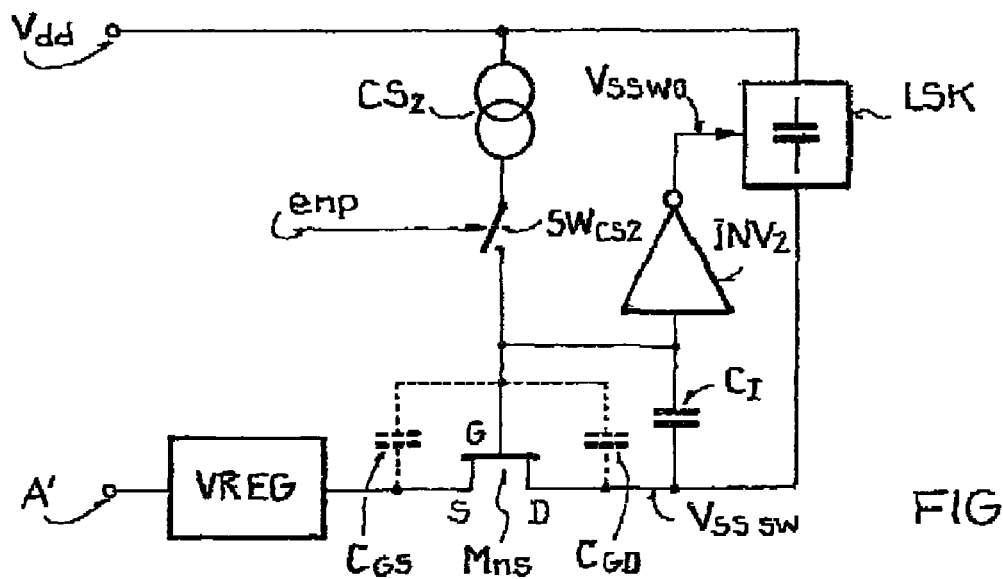
FIG. 3 shows a schematic circuit diagram of a third exemplary embodiment with an NMOS field-effect transistor as a semiconductor switch.

FIG. 3 shows a substantially complementary circuit for FIG. 2. The load circuit LSK in this exemplary embodiment is controlled as a function of the status signal Vsswo. An NMOS field-effect transistor Mns, which is connected to the switch $SW_{CS2}$, inverter $INV_2$, voltage regulator VREG, and load circuit LSK, is provided as a semiconductor switch. The switch $SW_{CS2}$ is in turn connected to the constant current source $CS_2$. At the voltage regulator VREG, an unregulated voltage is applied at terminal A'.

The load circuit LSK can be switched between an operating mode and a sleep mode with a reduced current consumption. In the sleep mode, a leakage current of the load circuit LSK is turned off by the semiconductor switch of the NMOS field-effect transistor Mns. Advantageously, for this purpose, the load circuit LSK sends the control signal enp to the switch $SW_{CS2}$. The switch $SW_{CS2}$ is opened as a result, so that the gate potential at gate G of the NMOS field-effect transistor Mns drops rapidly.

The inverter $INV_2$ inverts this negative edge to a positive edge. A positive edge of the status signal Vsswo advantageously triggers an interrupt signal to interrupt a program run in the load circuit LSK. It is also possible that the load circuit LSK has an analog circuit, for example, an amplifier or mixer; in this case, the analog circuit is deactivated by the status signal Vsswo before the semiconductor switch Mns closes, so that undefined states can be avoided.

Figure 4:
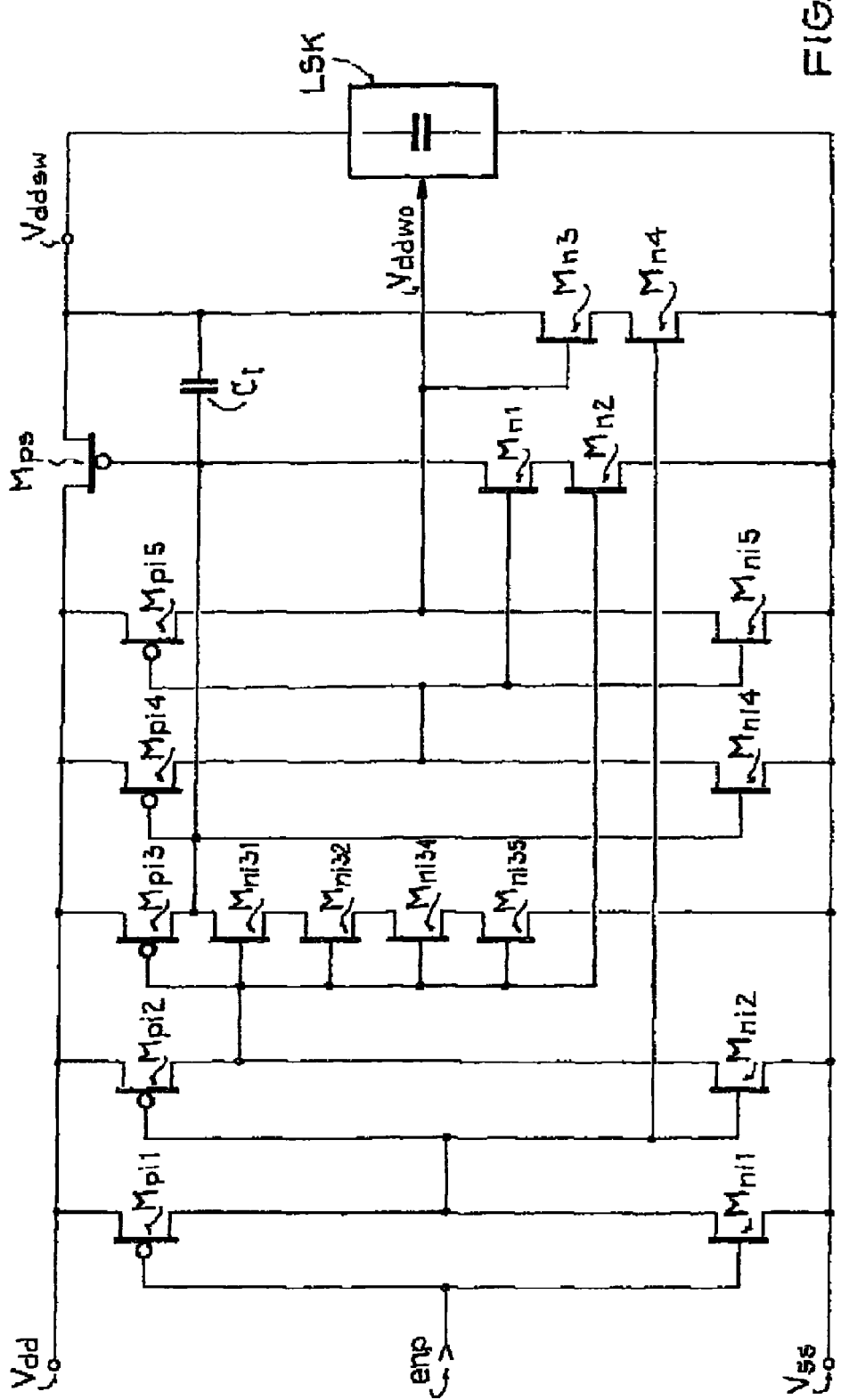
FIG. 4 shows a schematic circuit diagram of a fourth exemplary embodiment in CMOS technology.

In FIG. 4, a section of a circuit is shown with a PMOS field-effect transistor Mps as a semiconductor switch, with a (fourth) inverter formed from the MOS field-effect transistors Mpi4 and Mni4 as a threshold switch, and with a constant current source formed from transistors Mni31, Mni32, Mni34, Mni35 and the capacitor $C_I$ together as an integrator. The control signal enp is inverted twice by two inverters; here, the first inverter is formed by the MOS field-effect transistors Mpi1 and Mni1 and the second inverter by the MOS field-effect transistors Mpi2 and Mni2. The constant current source Mni31, Mni32, Mni34, Mni35 can be switched by the output signal of the second inverter Mpi2, Mni2.

The NMOS field-effect transistors Mni31, Mni32, Mni34, Mni35, moreover, form a third inverter with the PMOS field-effect transistor Mpi3. The fifth inverter is formed from the MOS field-effect transistors Mpi5 and Mni5 and inverts the output signal of the fourth inverter. The output of the fifth inverter Mpi5, Mni5 provides the status signal Vddwo for the load circuit LSK. The NMOS field-effect transistors Mn1 and Mn2 are connected in series and form a logic AND operation. Both NMOS field-effect transistors Mn1 and Mn2 are conductive only when the output value of the threshold switch Mpi4, Mni4 assumes the value "high" and the control signal enp has the value "high." In this case, the gate potential of the PMOS field-effect transistor Mps is connected to the supply voltage potential Vss (ground).

The NMOS field-effect transistors Mn3 and Mn4 are also connected in series and form a logic AND operation. Both NMOS field-effect transistors Mn3 and Mn4 are conductive only when the output value of the threshold switch Mpi4, Mni4 assumes the value "low" and the control signal enp has the value "low." In this case, the gate potential of the PMOS field-effect transistor Mps is connected to the positive supply voltage potential Vdd via the PMOS field-effect transistor Mpi3. Capacitor $C_I$ is therefore completely recharged.

The invention in this case is not limited to the shown exemplary embodiments. Instead of field-effect transistors, other monolithic integrated semiconductor switches, such as bipolar transistors, can also be used. Other functions of the load circuit can also be controlled by the status signal Vddwo. It is also possible to form the integrator differently, for example, by means of a differential amplifier.

The functionality of the semiconductor arrangement of the exemplary embodiment shown in FIGS. 1 to 4 can be used especially advantageously for a battery-operated system, for example, for a battery operated radio system or radio network.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A monolithic integrated circuit comprising:
    a semiconductor switch;
    a constant current source;
    a capacitor; and
    a load circuit that has a load capacitance,
    wherein an output of the semiconductor switch is connected to the load circuit to turn on and off a supply voltage of the load circuit,
    wherein the capacitor is connected to the output of the semiconductor switch and to a control input of the semiconductor switch,
    wherein the constant current source is connectable to the control input of the semiconductor switch, and
    wherein the threshold switch outputs a status signal to control the load circuit.

2. The monolithic integrated circuit according to claim 1, further comprising a voltage regulator for providing the supply voltage, which is connectable to an input of the semiconductor switch.

3. The monolithic integrated circuit according to claim 1, wherein the constant current source has a current control input for switching a constant current of the constant current source.

4. The monolithic integrated circuit according to claim 1, further comprising a threshold switch, whose input is connectable to the constant current source.

5. The monolithic integrated circuit according to claim 1, wherein the output of the threshold switch is connected directly or indirectly to an input of the load circuit.

6. The monolithic integrated circuit according to claim 1, wherein the output of the semiconductor switch is connected to a supply voltage terminal of the load circuit.

7. The monolithic integrated circuit according to claim 4, further comprising:
    a first transistor connected to the control input of the semiconductor switch,
    wherein a first control input of the first transistor is connected to the threshold switch.

8. The monolithic integrated circuit according to claim 7, further comprising:
    a second transistor connected to the first transistor to form a logic AND operation,
    wherein a second control input of the second transistor is connected to the current control input of the constant current source.

9. A method for reducing a leakage current of a load circuit via a semiconductor switch, the load circuit being monolithically integrated together with the semiconductor switch, the method comprising:
    connecting the semiconductor switch to a voltage regulator, which provides a supply voltage for the load circuit;
    connecting an output of the semiconductor switch to the load circuit to turn the supply voltage on and off; and
    connecting an integrator to the output of the semiconductor switch, the integrator having an output connected to a control input of the semiconductor switch so that an output value of the integrator controls a switching resistance of the semiconductor switch,
    wherein the load circuit has a plurality of digital and/or analog functions, and wherein at least one of the functions is started and/or stopped based on the output value of the integrator.

10. The method according to claim 9, wherein the load circuit is switchable between an operating mode and a sleep mode with a reduced current consumption, and wherein, in the sleep mode, a leakage current of the load circuit is minimized by the semiconductor switch.

11. The method according to claim 9, comprising a plurality of load circuits of a monolithic integrated circuit, each with a semiconductor switch to reduce the leakage current of the respectively connected load circuit, in which only the load circuits required for the actual function are switched to an operating mode and the leakage current of the other load circuits is turned off.

12. A method for reducing a leakage current of a load circuit via a semiconductor switch, the load circuit being monolithically integrated together with the semiconductor switch, the method comprising:
    connecting the semiconductor switch to a voltage regulator, which provides a supply voltage for the load circuit;
    connecting an output of the semiconductor switch to the load circuit to turn the supply voltage on and off; and
    connecting an integrator to the output of the semiconductor switch, the integrator having an output connected to a control input of the semiconductor switch so that an output value of the integrator controls a switching resistance of the semiconductor switch,
    wherein the load circuit has a plurality of digital and/or analog functions, and wherein the integrator has a controllable input, so that the integrator is controllable for starting and/or stopping at least one of the functions.

* * * * *